(12) United States Patent
Hardwick et al.

(10) Patent No.: US 7,599,827 B2
(45) Date of Patent: *Oct. 6, 2009

(54) EVALUATING HARDWARE MODELS HAVING RESOURCE CONTENTION

(75) Inventors: Jonathan C. Hardwick, Kirkland, WA (US); Efstathios Papaefstathiou, Redmond, WA (US)

(73) Assignee: Microsoft Corporation, Redmond, WA (US)

( * ) Notice: Subject to any disclaimer, the term of this patent is extended or adjusted under 35 U.S.C. 154(b) by 557 days.

This patent is subject to a terminal disclaimer.

(21) Appl. No.: 11/277,279

(22) Filed: Mar. 23, 2006

(65) Prior Publication Data

US 2006/0168166 A1 Jul. 27, 2006

Related U.S. Application Data

(63) Continuation of application No. 10/053,731, filed on Jan. 18, 2002, now Pat. No. 7,167,821, which is a continuation-in-part of application No. 09/632,522, filed on Aug. 4, 2000, now Pat. No. 6,925,431.

(60) Provisional application No. 60/209,759, filed on Jun. 6, 2000.

(51) Int. Cl.
G06F 9/45 (2006.01)
G06F 11/30 (2006.01)

(52) U.S. Cl. ......................... 703/22; 702/182
(58) Field of Classification Search .............. 703/22; 702/182
See application file for complete search history.

(56) References Cited

U.S. PATENT DOCUMENTS

| | | | |
|---|---|---|---|
| 5,408,663 A * | 4/1995 | Miller | .......... 718/104 |
| 5,598,532 A | 1/1997 | Liron | |
| 5,742,587 A | 4/1998 | Zornig et al. | |
| 5,752,002 A | 5/1998 | Naidu et al. | |
| 5,761,684 A | 6/1998 | Gibson | |
| 5,794,005 A | 8/1998 | Steinman | |
| 5,850,538 A | 12/1998 | Steinman | |
| 5,960,181 A | 9/1999 | Sanadidi et al. | |
| 6,014,505 A | 1/2000 | Schorn | |
| 6,189,142 B1 * | 2/2001 | Johnston et al. | .......... 717/125 |
| 6,268,853 B1 | 7/2001 | Hoskins et al. | |
| 6,324,495 B1 | 11/2001 | Steinman | |
| 6,366,931 B1 | 4/2002 | Borowsky et al. | |
| 6,556,950 B1 | 4/2003 | Schwenke et al. | |
| 6,577,906 B1 | 6/2003 | Hurtado et al. | |
| 8,925,431 | 8/2005 | Papaefstathiou | |

(Continued)

OTHER PUBLICATIONS

Andradottir, "A Review of Simulation Optimization Techniques", Proceedings of the 1998 Winter Simulation conference, pp. 151-158.

(Continued)

*Primary Examiner*—Paul L Rodriguez
*Assistant Examiner*—Dwin M Craig
(74) *Attorney, Agent, or Firm*—Lee & Hayes, PLLC

(57) ABSTRACT

A performance prediction simulator gives effect to the resource contention among multiple resources in a simulated system by adjusting event durations appropriately. A resource topology tree defining the resource configuration of the system is input to the simulator. The simulator includes an evaluation engine that determines the amount of resource used during each simulation interval of the simulation and records the resource usage in a resource contention timeline, which can be displayed to a user. The amount of resource used during a simulation is also used to adjust the event duration calculations of the hardware models associated with each event.

17 Claims, 10 Drawing Sheets

U.S. PATENT DOCUMENTS 7,167,821 B2 * 1/2007 Hardwick et al. ............. 703/22
7,440,883 B2 * 10/2008 Hardwick et al. ............. 703/22

OTHER PUBLICATIONS

Azadivar, "Simulation Optimization Methodologies"; Proceedings of the 1999 Winter Simulation Conference, pp. 93-100.

Boesel, et al, "A Framework for Simulation-Optimization Software"; Technical Report; Department of Industrial Engineering and Management Sciences, Northwestern University; May 1999; 25 pages.

Boesel, et al, "Future of Simulation Optimization"; Proceedings of the 2001 Winter Simulation Conference; pp. 1466-1469.

Chong, et al, "A Framework for Simulation-Based Network Control Via Hindsight Optimization", Conference on Decision and Control (CDC), 2000; 6 pages.

Gehlsen, et al, "A Framework for Distributed Simulation Optimization"; Proceedings of the 2001 Winter Simulation Conference, pp. 508-514.

Hardwick et al. "Modeling the Performance of E-Commerce Sites", Microsoft Research Limited. Dec. 2001.

Humphrey, et al, "A Revised Simplex Search Procedure for Stochastic Simulation Response-Surface Optimization", Proceedings of the 1998 Winter Simulation Conference, pp. 751-759.

Joshi, et al, "Framework for the Optimization of Discrete-Event Simulation Models", Prceedings of the 17th ASEM National Conference; Oct. 10-12, 1996, 7 pages.

Leymann, Prof. Dr. Frank, "Web Services Flow Language", May 2001, 108 pages.

Loosley, et al, "E-Commerce Response Time: A Reference Model", in Proceedings of the Computer Measurement Group's 2000 International Conference (CMG2000), Dec. 2000, pp. 1-16.

Neddermeijer, et al, "A Framework for Response Surface Methodology for Simulation Optimization", Proceedings of the 2000 Winter Simulation Conference, pp. 129-136.

Papaeftstathiou, "Design of a Performance Technology Infrastructure to Support the Construction of Responsive Software", 2000. Ontario Canada.

Petriu, et al, "Applying the UML Performance Profile: Graph Grammar-Based Derivation of LQN Models from UML Specification", Feb. 2002, Ontario, Canada, 19 pages.

Selic, et al, "Response to the OMG RFP for Schedulability, Performance and Time", Jun. 17, 2001, 222 pages.

Spellman, et al, "eBusiness Performance: Risk Mitigation in Zero Time", in Proceedings of the Computer Measurement Group's 2000 International Conference (CMG2000), Dec. 2000, pp. 1-11.

Swisher, et al, "A Survey of Simulation Optimization Techniques and Procedures", Proceedings of the 2000 Winter Simulation Conference, pp. 119-128.

Thompkins, "Policy Driven, Multi-Objective Optimizationo of Simulated Stochastic Models", http://www.ncsa.uiuc.edu/TechFocus/Projects/NCSA/PolicyDriven_Multi-Objective_Optimization_of_Simulated_Stochastic_Models.html; 3 pages, last updated Apr. 28, 2003.

"Web Services Description Language (WSDL)"; Mar. 15, 2001, 59 pages, http://www.w3.org/TR/wsdl.

* cited by examiner

EVALUATING HARDWARE MODELS HAVING RESOURCE CONTENTION

RELATED APPLICATIONS

This application is a continuation of U.S. patent application Ser. No. 10/053,731, filed Jan. 18, 2002, now U.S. Pat. No. 7,167,821 which is hereby incorporated by reference herein. U.S. patent application Ser. No. 10/053,731 is a continuation-in-part of U.S. patent application Ser. No. 09/632,522, filed Aug. 4, 2000, now U.S. Pat. No. 6,925,431. U.S. patent application Ser. No. 10/053,731, and U.S. patent application Ser. No. 09/632,522, claim priority to U.S. Provisional Application No. 60/209,759, filed Jun. 6, 2000.

TECHNICAL FIELD

The invention relates generally to computer system performance simulation, and more particularly to a performance simulation infrastructure that considers the impact of resource contention.

BACKGROUND

Performance simulation of software systems running on one or more computers is a crucial consideration for developers deploying network-based services, such as those services available over the Internet, an intranet, or an extranet. For example, developers often want to determine how their software design decisions will affect future system performance. Likewise, system users want to determine the optimal mix of hardware to purchase for an expected system load level, and system administrators want to identify the bottlenecks in their system and the system load levels at which to expect performance problems.

During the design of such software services, a software developer may employ performance modeling tools to model the system prior to release, in hope of finding an optimal design and to identify and troubleshoot potential problems. With such preparation in the design and implementation phases of the systems, the developer stands an improved probability of maintaining the necessary system performance demanded by users under a variety of conditions. However, many developers merely use ad-hoc or custom performance modeling techniques based on simple linear regression models. More sophisticated and more accurate approaches are desirable.

One problem with existing approaches for modeling performance of a system is that contention for use of system resources is not accurately modeled at high load levels. Under such load conditions, a resource may be subject to events generated by multiple other resources within the system. Such events may exceed the performance capabilities of the resource; therefore, some of the events may be rejected or delayed by the resource until it is capable of handling the events.

Another problem with existing approaches for modeling performance of a system is that feedback about such resource contention is not easily and accurately communicated to the user. Feedback is either too abstract (a single delay value) or too detailed (detailed event logs). In some approaches, for example, the user merely receives an indication that the system ran the workload in X seconds. Alternatively, a user may receive an indication that an individual event in the workload required Y milliseconds to complete. However, neither approach offers any explanation as to why these simulation times resulted. It would be more helpful to offer feedback indicating that, for example, the system's ability to access a given disk or communication channel was overloaded, thereby resulting in a slower than expected performance.

SUMMARY

Embodiments of the present invention solve the discussed problems by providing a performance simulation infrastructure that generates resource contention timelines ("RCTs") representing load levels (i.e., resource usage) on various system resources over the course of a performance simulation. Such systems typically includes both software and hardware elements. A performance prediction simulator gives effect to the resource contention among multiple resources in the simulated system by adjusting event durations appropriately. A resource topology tree defining the resource configuration of the system is input to the simulator. The simulator includes an evaluation engine that determines the amount of resource used during each simulation interval of the simulation and records the resource usage in a resource contention timeline, which can be displayed to a user. The amount of resource used during a simulation is also used to adjust the event duration calculations of the hardware models associated with each event. Each RCT can be presented to a user in a graphical or text format to provide rich feedback about system bottlenecks resulting from resource contention.

In one implementation of the present invention, a computer-readable medium having stored thereon a data structure for recording resource contention of a system under simulation is provided. The data structure is associated with a give resource or resource type. A first data field contains data representing a start time for a simulation interval in a performance simulation system simulating performance of the system. A second data field contains data representing an amount of the resource used during the simulation interval by the simulated system.

In other implementations of the present invention, articles of manufacture are provided as computer program products. One embodiment of a computer program product provides a computer program storage medium readable by a computer system and encoding a computer program that determines an amount of a resource consumed during a simulation interval in a performance prediction simulation of a system. Another embodiment of a computer program product may be provided in a computer data signal embodied in a carrier wave by a computing system and encoding the computer program that determines an amount of a resource consumed during a simulation interval in a performance prediction simulation of a system.

A computer program product embodiment of the present invention encodes a computer program for executing on a computer system a computer process for determining an amount of a resource consumed during a simulation interval in a performance prediction simulation of a system. An aggregate resource requirement associated with the resource in a simulation interval is calculated. A system event horizon for the simulation interval is calculated based on a resource usage state change in the simulated system. The aggregate resource requirement based on the system event horizon is adjusted to provide an adjusted aggregate resource requirement for the resource, wherein the adjusted aggregate resource requirement represents the amount of the resource consumed during the simulation interval.

In another implementation of the present invention, a method of determining an amount of a resource consumed during a simulation interval in a performance prediction simulation of a system is provided. An aggregate resource requirement associated with the resource in a simulation interval is calculated. A system event horizon for the simulation interval is calculated based on a resource usage state change in the simulated system. The aggregate resource requirement is adjusted based on the system event horizon to provide an adjusted aggregate resource requirement for the resource, wherein the adjusted aggregate resource requirement represents the amount of the resource consumed during the simulation interval.

In yet another embodiment of the present invention, a performance simulation system for simulating performance of a simulated system including a resource configuration is provided. A sequence processor is capable of receiving a resource topology tree describing the resource configuration of the simulated system. A calculation module calculates an aggregate resource requirement associated with the resource in a simulation interval and calculates a system event horizon for the simulation interval based on a resource usage state change in the simulated system. An interval module adjusts the aggregate resource requirement based on the system event horizon to provide an adjusted aggregate resource requirement for the resource, wherein the adjusted aggregate resource requirement represents the amount of the resource consumed during the simulation interval.

In another embodiment of the present invention, an evaluation engine for simulating performance of a simulated system including a resource is provided. A calculation module calculates an aggregate resource requirement associated with the resource in a simulation interval and calculates a system event horizon for the simulation interval based on a resource usage state change in the simulated system. An interval module adjusts the aggregate resource requirement based on the system event horizon to provide an adjusted aggregate resource requirement for the resource, wherein the adjusted aggregate resource requirement represents the amount of the resource consumed during the simulation interval.

In another embodiment of the present invention, a method of determining an amount of a resource consumed during a performance prediction simulation of a system is provided. A resource configuration of the simulated system is defined to include at least one resource. The resource is associated with a resource contention timeline. An amount of the resource used during one or more simulation intervals of the performance prediction simulation is calculated. A resource contention timeline entry for each of the one or more simulation intervals is inserted into the resource contention timeline, each resource contention timeline entry specifying an amount of the resource used during the simulation interval associated with the resource contention timeline entry.

In other implementations of the present invention, articles of manufacture are provided as computer program products. One embodiment of a computer program product provides a computer program storage medium readable by a computer system and encoding a computer program that determines an amount of a resource consumed during a performance prediction simulation of a system. Another embodiment of a computer program product may be provided in a computer data signal embodied in a carrier wave by a computing system and encoding the computer program that determines an amount of a resource consumed during a performance prediction simulation of a system.

A computer program product embodiment of the present invention encodes a computer program for executing on a computer system a computer process for determining an amount of a resource consumed during a performance prediction simulation of a system. A resource configuration of the simulated system is defined to include at least one resource. The resource is associated with a resource contention timeline. An amount of the resource used during one or more simulation intervals of the performance prediction simulation is calculated. A resource contention timeline entry for each of the one or more simulation intervals is inserted into the resource contention timeline, each resource contention timeline entry specifying an amount of the resource used during the simulation interval associated with the resource contention timeline entry.

These and various other features as well as other advantages, which characterize the present invention, will be apparent from a reading of the following detailed description and a review of the associated drawings.

DETAILED DESCRIPTION

During development of a net-based service application, it is beneficial to simulate the operation of the application within a model of the overall system in which it is expected to execute. For example, an e-commerce retail application that allows consumers to shop for a company's products over the Internet will operate in a system including various web servers, routers, communication links, database servers, clients, power supplies, etc. Simulation of the system allows a developer to understand how his or her design decisions impact the system's performance in real-world conditions. Simulation of the system can also assist a system user in making hardware purchase and system architecture decisions and assist a system administrator to identify bottlenecks and to anticipate performance problems at given load levels.

Such bottlenecks and performance problems may be attributable to resource contention within the system. For example, at high system load levels, if more requests to access a disk are made than a storage system can handle, some of the requests may be ignored or delayed by the storage system, thereby reducing overall system performance. Identifying such problems during design of the system can allow a developer to modify the software design or a system user to supplement the hardware topology of the system in the hope of improving overall system performance at anticipated load levels.

Figure 1:
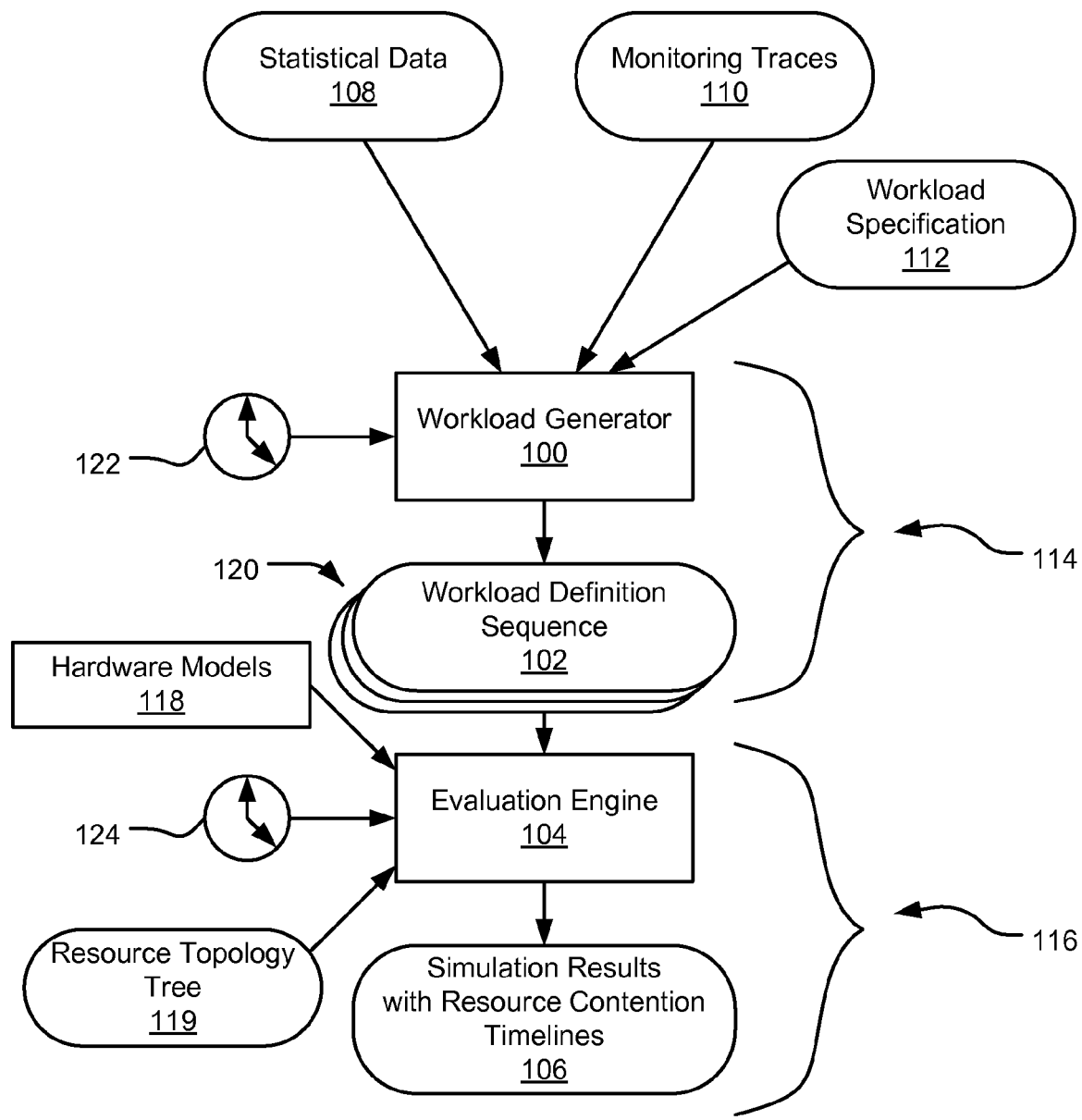
FIG. 1 illustrates two stages of a performance simulation flow and associated data stores in an embodiment of the present invention.

FIG. 1 illustrates two stages of a performance simulation flow and associated data in an embodiment of the present invention. A workload generator 100 receives one or more inputs to generate one or more workload definition sequences 120 (also called Workload Request Timelines or WRTs), which characterize a sequence of requests that affect the status of the system being simulated. The inputs may be received by the workload generator 100 individually or in any combination or sequence.

The term "sequence" implies that at least two workload requests within a workload definition sequence have a sequential relationship relative to different simulation intervals. For example, in one embodiment, one request is defined as completing evaluation in one simulation interval and another request is defined as beginning evaluation in an ensuing simulation interval. A workload definition sequence represents a series of workload requests that represent logical workload units. For example, a transaction with a database or an e-commerce site can be defined as a workload definition sequence. Each workload request in a workload definition sequence defines one or more events, the cause of each event, the result of each event (e.g., event causality), and other parameters (e.g., cost in terms of CPU cycles, bandwidth, and storage). Events are tagged with the type of resource that can handle the event and a run-time policy (e.g., a scheduling policy) defining how to choose among available resource instances of the appropriate type.

A clock 122, or some other means of determining time-dependence or interrelation among the various workload definition sequences 120, may be used to set an initiation parameter (e.g., a start time) on a start node in one or more of the workload definition sequences 120. An evaluation engine 104 receives the one or more workload definition sequences 120 and generates simulation results 106, which include the simulated times required for the system to complete each workload request. In other words, the evaluation engine 104 calculates the predicted duration of each component event of the requests in the system to predict system performance.

A workload definition sequence 102 is created by the workload generator 100 in the first stage of simulation, i.e., the workload definition stage 114. The workload definition sequence 102 is then input to the evaluation engine 104 in an evaluation stage 116, which can complete the simulation without requesting any additional workload generation operation from the workload generator 100.

The workload definition sequence 102 defines sequentially related workload requests representing real-world transactions. A workload request is represented by a workload request node in a workload definition sequence. Using control flow nodes, a workload definition sequence may be forked and rejoined (e.g., representing the spawning and killing of process threads). In one embodiment, a workload definition sequence 102 is triggered at a specific instant of time (e.g., relative to a simulation clock 124) and terminates when the last request is processed. The trigger time is also referred to as a start time.

A workload request node specifies a "previous" node, a "next" node, the type of request (e.g., compute, send, etc.), one or more entities associated with the request (e.g., from a client, to a web server), and other parameters useful in describing the request (e.g., the cost in CPU cycles, communication bandwidth, or storage). An individual request is translated into its component events during simulation. For example, a "send" request may be translated into a "send" event in a client and a "receive" event in a server.

One exemplary input to the workload generator 100 is represented by statistical data 108. The statistical data 108 provides a stochastic model of requests that a simulated application would expect to process over a period of operation. Requests generally refer to messages received by the application from another system entity. Requests may include without limitation requests that the application perform a specified function, inquiries for data accessible by the application, acknowledgments from other entities, and messages providing information to the application. For example, by monitoring the requests processed by a comparable application, a developer may determine that the simulated application would expect to receive: (1) requests to access a database server [20%]; (2) requests to add an item to a shopping cart [17%]; (3) requests to search the web site [35%]; and (4) requests to view a product [28%]. Many other requests may be also represented within the statistical data 108.

A developer may augment the raw monitored statistical results with new requests supported in the simulated application (e.g., new features) that were not available in the monitored system. In addition, the developer may augment the monitored statistical results with changes that the developer anticipates with the new system. For example, a higher percentage of search requests may be expected in the new application, as compared to the monitored system, because of an improved design of the new application. Therefore, the developer may increase the percentage of search requests expected in the new application and decrease the expected percentage of other requests, or vice versa. Accordingly, based on the monitored stochastic model of a comparable system and the alterations supplied by the developer, if any, the statistical data 108 provides a representative mix of the requests that the simulated system should handle during a simulation, thereby approximating an anticipated request load for the simulated application.

Another exemplary input is represented by monitoring traces 110, which are typically rendered by monitoring tools observing the operation of a comparable system under an exemplary load. In contrast to the statistical data 108, which specifies the requests processed by the application being developed, the monitoring traces 110 represent the sequences of other requests related to (e.g., caused by or resulting in) the requests processed by the application.

For example, an application may experience requests for database queries received via the Internet, which occur 20% of the time. Each such request results from a client request transmitted through the Internet and a router to a web server on which the application is running. In response to receipt of each request, the application issues one or more requests to an SQL server coupled to the target database. The SQL server subsequently responds to the application with the result of the query. The application then transmits the query result via the router and the Internet to the client. As such, with each type of request processed by an application, there exists a sequence of related requests processed by various entities in the system. In an embodiment of the present invention, this sequence of related requests are defined in the monitoring traces 110. The level of abstraction or specificity represented by the requests in a monitoring trace may be dependent on various factors, including without limitation the needs of the developer, the precision of the monitoring tool, and the sophistication of the hardware models.

Another exemplary input is represented by a workload specification 112, which may be recorded in a performance specification language (PSL) or a wide variety of other means. PSLs enable users to specify performance characteristics of a particular system of interest. For example, PSLs may be employed in the design stage of software development to prototype the performance characteristics of an application. A PSL may also be used in later stages of software development to experiment with new software designs and resource configurations. For example, a software developer can create a PSL model of a system, including the application of interest as well as other entities (e.g., other applications such as an SQL server application; software components such as process threads; and hardware entities such as a client system, a router, a storage disk, or a communication channel).

The workload specification 112 comprises a set of hardware or virtual device usage request descriptions (i.e., resource usage request descriptions). Collectively, hardware devices and virtual devices are referred to as "resources". Hardware devices represent system components such as a CPU (central processing unit), a communications network, a storage medium, and a router. Virtual devices represent computer resources that are not associated with a particular tangible hardware device, including a software library, a socket communication port, a process thread, and an application. For example, a virtual device may represent a software library, such as a Message Passing Interface (MPI) to define a communication pattern.

A resource usage request description may identify various characteristics of a workload request, including a request identifier, an identified source device hardware model type, an identified target device hardware model type, and a workload configuration. The identified hardware models are subsequent used during the evaluation stage to translate the workload requests into component events and to calculate the delay associated with the identified resource usage request.

In an embodiment of the present invention, a resource topology tree 119 is input to the evaluation engine 104 (e.g., into a sequence processor of the evaluation engine 104) to define the hardware configuration of the system. A sequence processor manages active workload definition sequences during the simulation. A resource topology tree 119 defines the resources (and associated hardware models, if any) in the system and their interrelationships. The resource topology tree 119 also tags user-specified resources with RCTs, which may be used to compute the effects of resource contention on the performance of the system as well as providing resource contention feedback to the user. As shown, the simulation results 106 are associated with one or more resource contention timelines, such as shown by the graphical results illustrated in FIG. 9.

In summary, the monitoring traces 110 define the request sequences associated with a given transaction. The statistical data 108 defines the frequency of a given transaction during normal operation conditions. The workload specification 112 defines each request supported in the simulated system. The resource topology tree 119 defines the hardware configuration of the simulated system and specifies the associated RCTs. These inputs may be processed by the workload generator 100 to produce one or more workload definition sequences 120.

The evaluation engine 104 inputs the workload definition sequence 102 and simulates the system defined therein using one or more hardware models 118 to produce the simulation results 106. During simulation, one or more instances of the hardware models 118 are associated with one or more RCTs. An RCT is associated with one or more instances of a hardware model, wherein each instance represents a different system resource. The RCT stores information about the usage of the resource over time. The usage information is fed back to the instance of the hardware model to contribute to the duration calculations associated with that hardware model instance and the current active event. The resulting RCT is available in the simulation results 106 to provide feedback to the user about resource contention within the system.

An RCT generally includes one or more RCT entries or data fields, wherein each includes a start time, a resource type, and a resource requirement value. The start time indicates the RCT entry's order in the timeline, the resource type indicates the resource that is characterized by the RCT entry (as well as which timeline the RCT entry is associated with), and the resource requirement value is an aggregate value of all resource requirement contributions to the RCT entry during the current simulation interval. In one embodiment, the start time is represented by a scalar value and the resource type and resource requirement value are combined in an object, although other configurations of an RCT entry are contemplated within the scope of the present invention.

In one embodiment, a duration of an RCT comprises the difference between the start time of the current RCT and the start time of the next RCT. In an alternative embodiment, each RCT entry includes an explicit duration field defining the duration of the aggregate resource requirement.

The evaluation engine 104 may also process multiple workload definition sequences concurrently. During evaluation, the evaluation engine 104 activates one or more of the workload definition sequences 120 based on a predetermined condition. In one embodiment, the predetermined condition is the start time recorded in association with a start node of the sequence, although other conditions are contemplated within the scope of the present invention, such as the occurrence of specified event derived from another workload definition sequence or an external signal (e.g., from another evaluation engine).

Each workload request node in a workload definition sequence comprises one or more component events. For example, a request from a web server for an SQL (structured query language) query to an SQL server may comprise several exemplary internal events, such as (a) transmitting the request from the web server to the SQL server; (b) communicating the request over a local area network; and (c) receiving the query request at the SQL server; (c) executing the query request in the database. Rather than model each of these events as a separate request node within a workload definition sequence, the SQL request node may be modeled as a single request node having multiple component events known to the hardware model representing the web server, the network, or the SQL server. Therefore, SQL request is translated into the set of component events using the appropriate hardware model before simulation. The level of abstraction or specificity represented by a request node may be dependent on various factors, including without limitation the needs of the developer and the sophistication of the hardware models. The performance simulation infrastructure is flexible enough to accommodate a wide variation in the level of modeling precision.

It should be understood that a performance simulation system that employs resource contention timelines need not be restricted to a two-stage performance simulation infrastructure such as the one described with regard to FIG. 1. The system illustrated in FIG. 1 is merely an exemplary performance simulation infrastructure taking advantage of an embodiment of the present invention.

Figure 2:
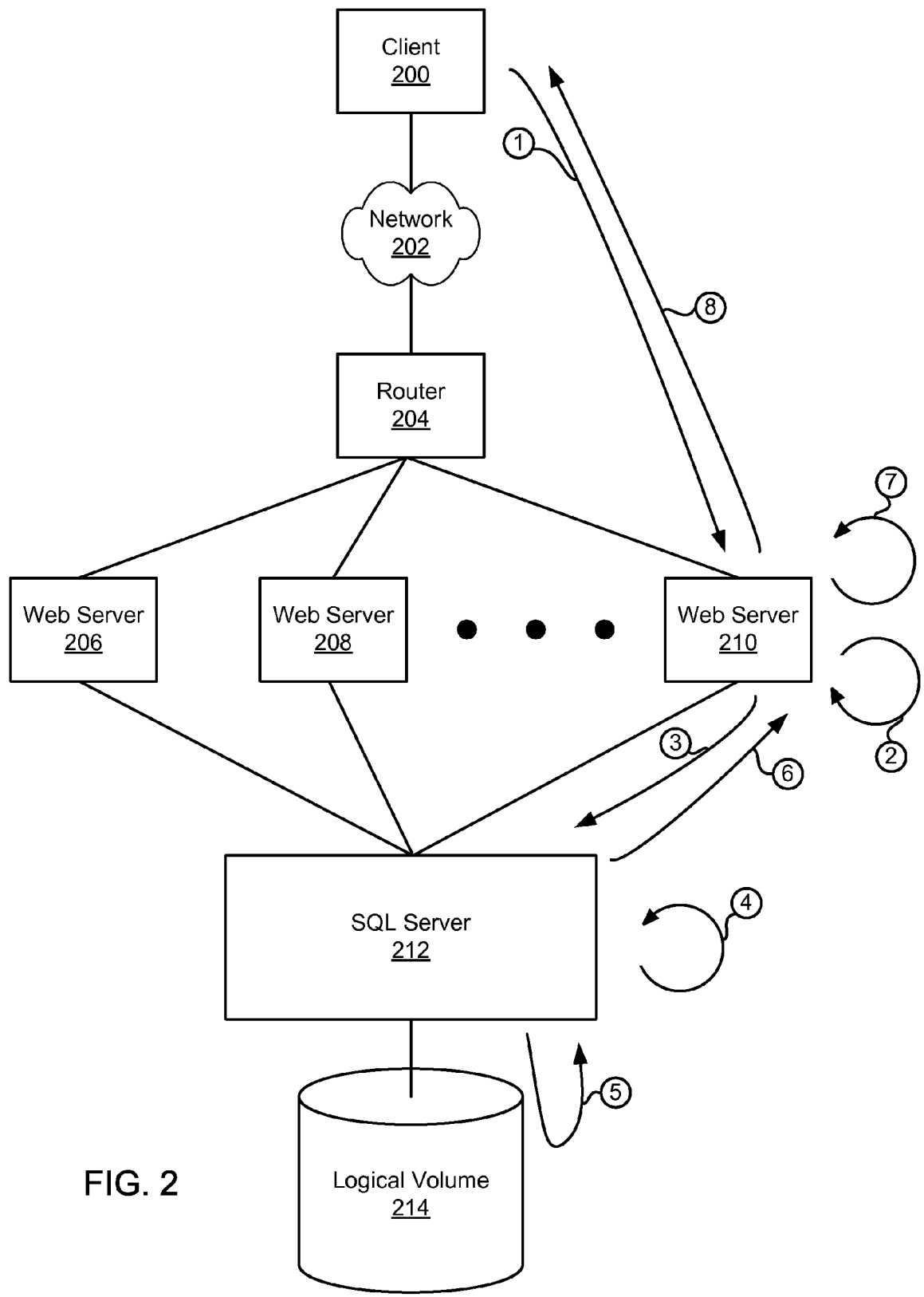
FIG. 2 illustrates an exemplary sequence of requests associated with a query request to an application in an embodiment of the present invention.
Figure 3:
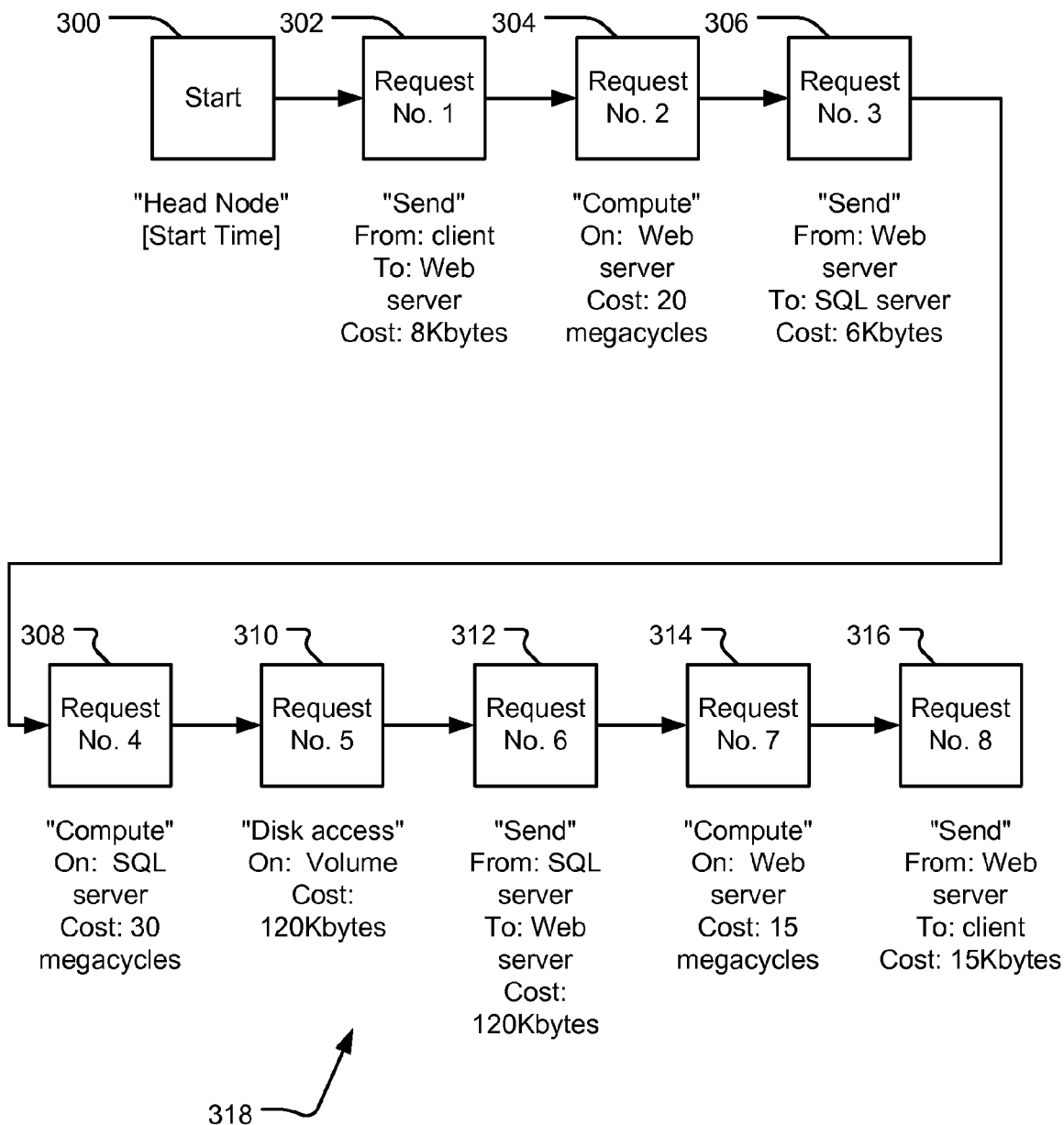
FIG. 3 illustrates nodes in a representation of an exemplary workload definition sequence associated with the requests depicted in FIG. 2 in an embodiment of the present invention.

FIG. 2 illustrates an exemplary sequence of requests associated with a query request to an application in an embodiment of the present invention. The individual requests defined for this example are depicted by the arrows labeled by a number in a circle, wherein the circled number represents a request's ordered position in the sequence of requests. FIG. 3 illustrates nodes in a representation of an exemplary workload definition sequence associated with the requests depicted in FIG. 2.

It should be understood that a workload definition may be generated to define an arbitration number of entities in the system, with varying levels of abstraction. For example, process threads and individual CPUs within each of the computing entities may be modeled, whereas in this example, only the server systems are modeled. However, each request may be broken down into "component events", which may consider individual process threads, CPU's, communication channels, etc.

The resource configuration illustrated in FIG. 2 includes various hardware devices and virtual devices. A client 200 represents a client computer system coupled to one of the web servers 206-210 via a communications network 202, such as the Internet, and a router 204. In a common scenario, the client 200 executes a browser through which a consumer accesses a vendor's on-line catalog. The exemplary Request No. 1 represents an inquiry about a product, possibly invoked by the consumer clicking an on-screen button or hypertext link. The request is directed to a given web site, provided by one of a plurality of web servers, which are shown as Web servers 206-210 and which may be embodied by IIS (Internet Information Server) systems or other Web server systems. In response to such consumer input, the Request No. 1 is transmitted through the network 202 and a router 204 to one of the Web servers 206-210.

The router 204 has multiple destination options. That is, the router 204 may route the Request No. 1 to any one of the multiple Web servers 206-210, which are running the server application that is being simulated. The selection of which Web server processes the request from the router may be controlled by a scheduling policy during simulation.

A Request No. 2 represents computations by the selected Web server 210, responsive to the Request No. 1. A Request No. 3 represents an SQL query generated by the Web server 210 to the SQL server 212. A Request No. 4 represents computations by the SQL server 212 in processing the SQL query of the Request No. 3, which results in a Request No. 5 representing a storage access to a logical volume 214 that stores a database. A Request No. 6 represents a response to the SQL query, transmitted from the SQL server 212 to the same Web server 210 that generated the Request No. 3. A Request No. 7 represents computations by the Web server 210 processing the results of the SQL query received from the SQL server 212 and generating a Request No. 8 for transmission to the client 200.

Each of these requests is defined in an exemplary workload definition sequence (see FIG. 3), which is generated by a workload generator. The workload definition sequence is then processed by an evaluation engine to accomplish the desired performance simulation of the system workload.

FIG. 3 illustrates nodes in a representation of an exemplary workload definition sequence 318 associated with the requests depicted in FIG. 2 in an embodiment of the present invention. By defining the workload as a sequence of workload request nodes, the workload may be defined completely in a first stage of the performance simulation and then be evaluated in an independent second stage of the performance simulation, without looping back to the workload generator after every simulation interval for the next workload state to be generated. As such, the sequence of workload states is already generated and defined in the workload definition sequence. Each request node may also be associated with parameters defining characteristics of the node in the workload sequence.

A node 300 represents a start node or head node, as described with regard to the workload definition sequences 120 in FIG. 1. A "start time" of the workload definition sequence is recorded as a parameter in association with the node 300. The start time is employed by the evaluation engine to start a given workload definition sequence during the simulation. Because multiple workload sequences may be active in any given simulation interval, the start time allows the evaluation to start the active sequences at predefined and potentially different times, in accordance with a simulation clock. It should be understood that other methods of starting workload sequences in the simulation stage may also be employed within the scope of the present invention.

A node 302 represents a workload request node, which can represent a type of request within the system. Workload request nodes are described with regard to the workload definition sequences 120 in FIG. 1. The node 302 is designated as a "send" request corresponding to Request No. 1 in FIG. 2, being communicated from the client to the Web server. Furthermore, other parameters may also be associated with the node 302, such as the bandwidth or storage cost of the request, which is shown as 8 kilobytes. A scheduler in the evaluation engine determines (e.g., based on a scheduling policy) which Web server receives the request.

A node 304 represents a workload request node that is designated as a "compute" request corresponding to Request No. 2 in FIG. 2. The compute request is designated to generate an SQL query from one of the Web servers in the system and is associated with a computational cost of 20 megacycles.

A node 306 represents a workload request node that is designated as a "send" request corresponding to Request No. 3 in FIG. 3. The send request is designated to be communicated from the Web server that processed the Request No. 2 to an SQL server. The cost of the requests is designated as 6 kilobytes.

A node 308 represents a workload request node that is designated as a "compute" request corresponding to Request No. 4 in FIG. 2. The compute request is designated to process the SQL query on an SQL server in the system and is associated with a computational cost of 30 megacycles.

A node 310 represents a workload request node that is designated as a "disk access" request corresponding to Request No. 5 in FIG. 2. The disk access request is designated to perform a storage access on a logical volume to satisfy the SQL query, with a cost of 120 kilobytes of bandwidth or storage.

A node 312 represents a workload request node that is designated as a "send" request corresponding to Request No. 5 in FIG. 3. The send request is designated to be communicated from the SQL server that processed the Request No. 4 to the Web server that processed Request No. 3. The cost of the requests is designated as 120 kilobytes.

A node 314 represents a workload request node that is designated as a "compute" request corresponding to Request No. 7 in FIG. 2. The compute request is designated to process the SQL query result on the Web server in the system that processed Request No. 3 and is associated with a computational cost of 15 megacycles.

A node 316 represents a workload request node designated as a "send" request corresponding to Request No. 1 in FIG. 2, being communicated from the Web server to the client. The send request is designated to communicate the SQL query result or data derived therefrom to the client. The cost of the requests is designated as 120 kilobytes.

An exemplary XML script defining a different resource topology is show below, relative to the hardware configuration show in FIG. 4. In one embodiment, as shown below, a resource topology representation is recorded in XML format. In alternative embodiments, other data formats may be employed to represent a resource topology of a system.

```
1   <system name="Two Tier Web Farm">
2     <active_resource type="computer" name="WebServer" count="4">
3       <rct name="memory" />
4         <active_resource type="cpu" name="WebServerCpu" count="2" >
5           <rct name="cpu" />
6             <active_resource type="thread" name="WebServerThrd" count="10">
7               <use_template name="PentiumIII450Mhz"/>
8             </active_resource>
9         </active_resource>
10    </active_resource>
11    <active_resource type="computer" name="SqlServer" count="2">
12      <rct name="cpu" />
13      <rct name="memory" />
14      <rct name="disk" />
15      <active_resource type="thread" name="SqlServerThrd" count="5">
16        <use_template name="Disk10ms"/>
17        <use_template name="PentiumIII450Mhz"/>
18      </active_resource>
19    </active_resource>
20    <active_resource type="computer" name="Client" count="100"/>
21    <passive_device type="network" name="Internet" ports="2000">
22      <use_template name="OptimumSpeed"/>
23    </passive_device>
24    <passive_device type="network" name="BackboneNetwork" ports="100">
25      <use_template name="Ethernet"/>
26    </passive_device>
27
28    <link active="Client[?]" passive="Internet" fromport="0" toport="999"/>
29    <link active="WebServer[?].?.?" passive="Internet" fromport="1000"
30      toport="1999"/>
31
32    <link active="WebServer[?].?.?" passive="BackboneNetwork"
33      fromport="0" toport="79"/>
34    <link active="SqlServer[?].?" passive="BackboneNetwork"
35      fromport="80" toport="99"/>
36  </system>
```

Exemplary Format for Defining a Resource Topology in XML

Figure 4:
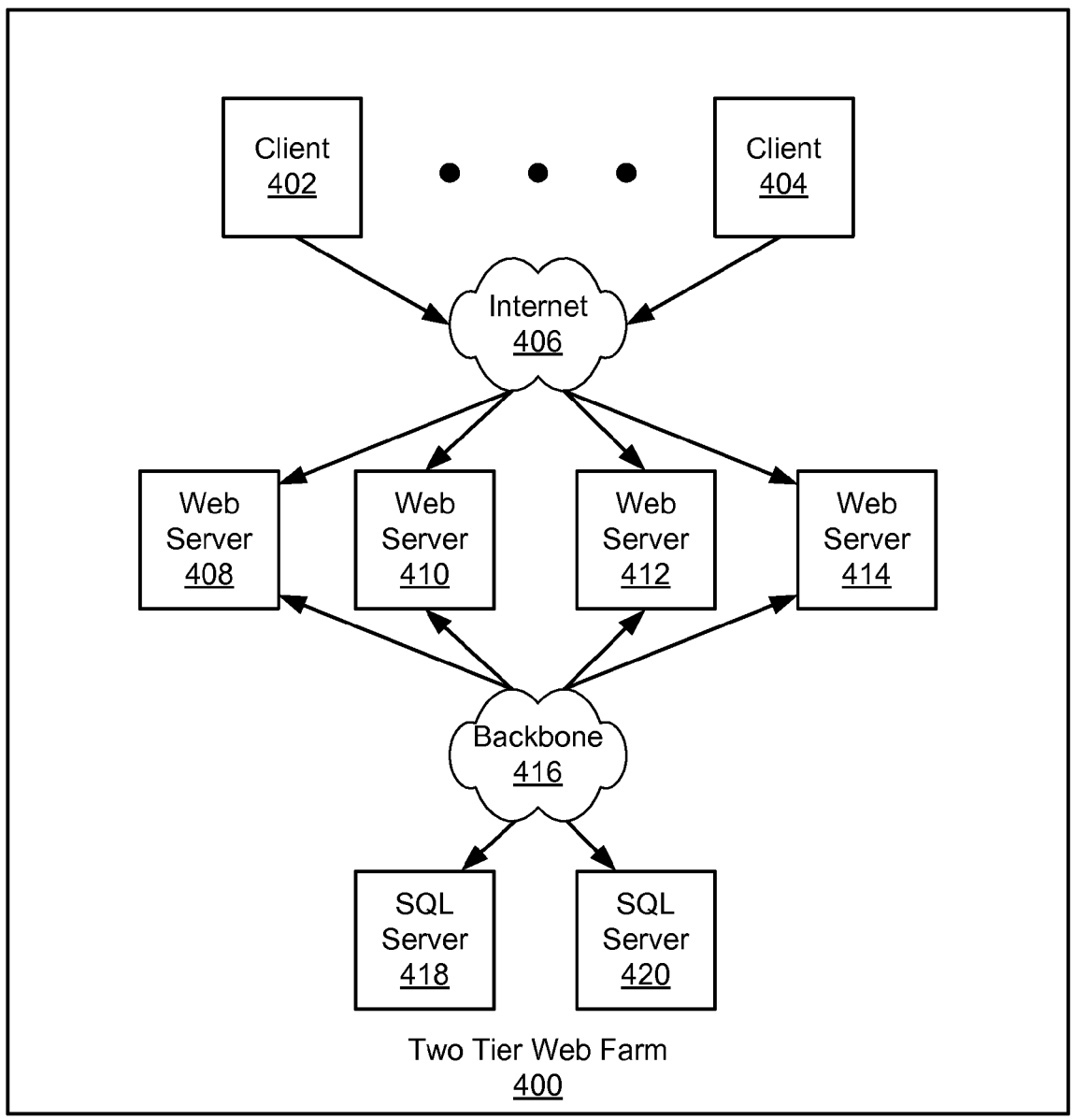
FIG. 4 depicts an exemplary hierarchical hardware configuration in an embodiment of the present invention.

FIG. 4 depicts an exemplary hierarchical hardware configuration (relating to the resource topology defined above) in an embodiment of the present invention. Resources within a system may be characterized as "active" or "passive". An active resource is capable of generating and servicing new events within the system, whereas a passive resource is capable of acting as a conduit for existing active resources. For example, a communications network is commonly represented as a passive resource, while most or all other resources are represented as active resources.

In an embodiment of the present invention, resources in a performance simulation are represented using a hierarchical tree structure matching the topology of the real system. This hierarchical tree structure may be reflected in an XML script (shown above) describing the resource topology shown in FIG. 4. The two-tier web farm 400 comprises a resource tree including individual web servers 408-414, clients 402-404, and SQL servers 418-420 (all active resources), as well as the various networks 406 and 416 (passive resources) interconnecting these active resources. Lower levels of the tree include resource nodes representing threads running on individual CPUs (see FIGS. 5 and 6), CPUs, memory, and storage disks, all of which are also considered active resources.

The following description of FIG. 4 will reference lines in the XML script listed above. Line 1 of the resource topology, for example, defines the simulated system, naming it "Two Tier Web Farm".

Lines 2-10 define a tier of active resources in the form of four web servers (i.e., each named "WebServer") of type "computer". These web servers are represented by web servers 408-414 in FIG. 4. Lines 11-19 define a second tier of active resources in the form of two SQL servers (i.e., each named "SqlServer") of type "computer." These SQL servers are represented by SQL servers 418-420 in FIG. 4. Line 20 defines one hundred client computers (i.e., each named "Client") of type "computer." These client computers are represented by client computers 402-404 in FIG. 4.

Lines 21-23 define a passive resource in the form of a communications network (i.e., named "Internet") of type "network." This resource is represented by network 406 in FIG. 4. The Internet 406 is defined as having 2000 ports (numbered 0-1999). Lines 24-26 define a passive resource in the form of a communications network (i.e., named "BackboneNetwork") of type "network." This resource is represented by Backbone 416 of FIG. 4. The Backbone 416 is defined has having 1000 ports (numbered 0-999).

In the illustrated embodiment, the relationships among various resources in the hardware typology are defined using "link" declarations. Line 28 defines a communication coupling between the active resources represented by the clients 402-404 with the passive resource represented by Internet 406. The "?" is a text pattern that represents the inclusion of all devices in a specific level in topology hierarchy. For example, any or all Client may be linked to the Internet in line 28. This notation is used in subsequent link statements to "link" multiple devices with networks in a single statement. The coupling is defined as being between a client computer port numbered "0" and a port on the Internet 406 numbered "999". Lines 29-32 define a communication coupling between the active resource WebServers 408-414 and the passive resource Internet 406. The coupling is defined as being between a web server port numbered "1000" and a port on the Internet 406 numbered "1999". A port is a point of interconnection of a passive device to an active device (and vice versa). In the context of a simulation, a port number can also be used as an additional input that is processed by the network model to determine communication costs, reflecting e.g. the internal topology of a switch on the network.

Lines 32-33 defines communication couplings between the active resource WebServers 408-414 and the passive resource Backbone 416. The coupling is defined as being between a web server numbered "0" and a port on the Backbone 416 numbered "79". Lines 34-35 define the linkages between the active resource SqlServers 418-420 and the passive resource Backbone 416. The coupling is defined as being between an SQL server numbered "80" and a port on the Backbone 416 numbered "99". The "link" directive includes the range of port numbers that the active device can use to connect to the network (passive device). The directives "fromport" and "toport" determine the range of the port values Generally, an RCT is used to incorporate the impact of resource contention on the performance prediction of a simulated system. In one embodiment, the use of an RCT may be logically divided into at least two stages (e.g., a create stage and an analysis stage), although a non-staged embodiment is also contemplated within the scope of the present invention. During a simulation interval, in a creation stage, each hardware model associated with at least one RCT generates a resource requirement for each active event that it is to simulate in the current simulation interval. The resource requirement represents the "amount" of the resource's capacity that is consumed by the active event in association with a given event duration.

Multiple hardware models may contribute to a single RCT entry for a given resource during the same simulation interval. In a simulation interval, the resource requirements of the contributing resources associated with a given RCT are combined to yield an aggregate resource requirement for the simulation interval. For example, multiple clients may send requests over the Internet in a single simulation interval. Accordingly, each client's hardware model contributes to the Internet resource's aggregate resource requirement for the simulation interval.

In one embodiment, the aggregate resource requirement is a sum of the resource requirements produced by each contributing hardware model. However, in an alternative embodiment, the aggregate resource requirement be generated by a variety of operations, including without limitation a non-linear mathematical algorithm and a bitwise OR operation yielding a bitmask representing available channels in a communications link (e.g., for switching networks) based on bitmask resource requirements provided by the contributing hardware models.

In an analysis stage, the aggregate resource requirement for each resource in the simulation interval is fed back into the hardware model. The hardware model calculates the duration of each event in accordance with the aggregate resource requirement generated for that resource in the simulation interval. The hardware models adjust their performance calculations based on the impact of the resource contention information, such as by holding off an event until another simulation interval commences or by increasing the event duration prediction to accommodate the resource contention impact.

Figure 5:
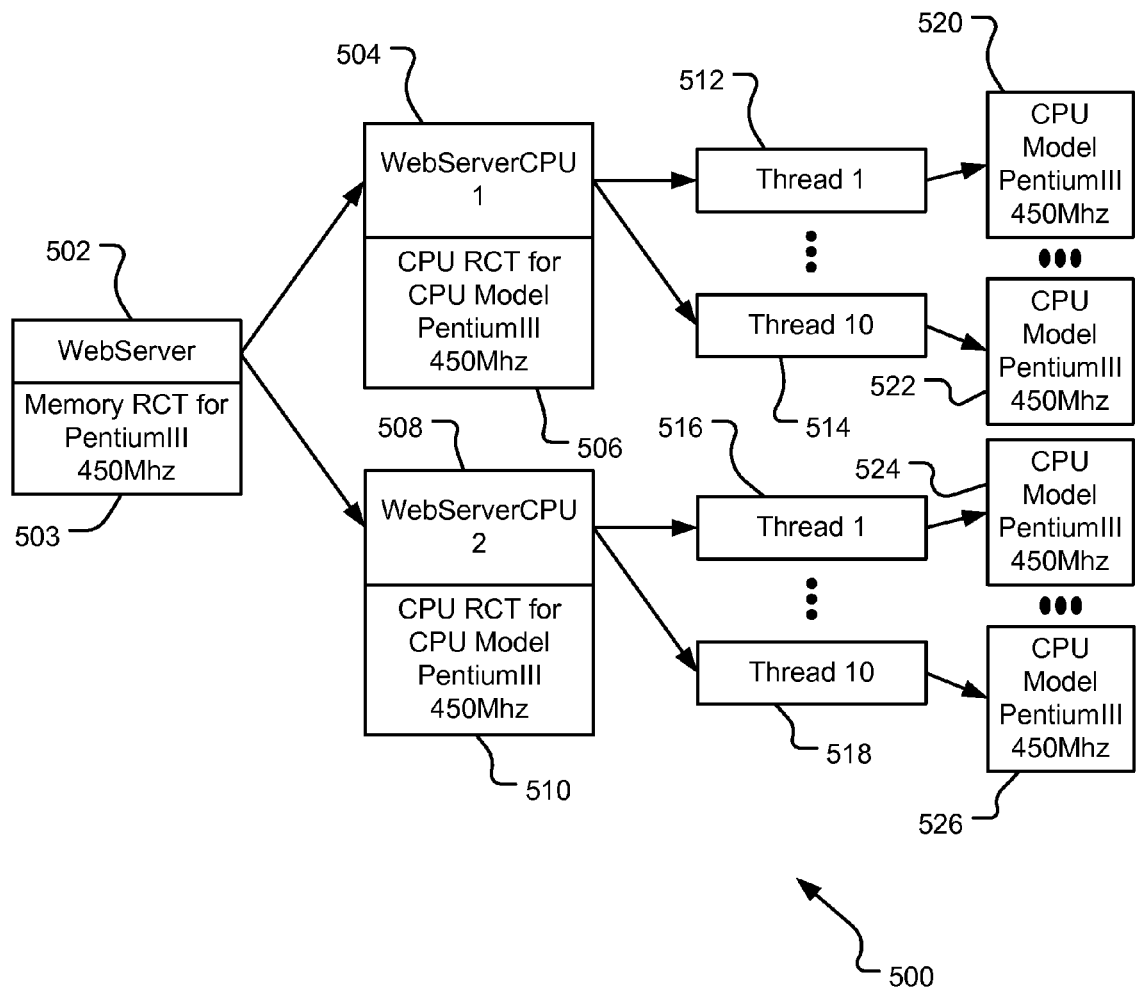
FIG. 5 depicts details of one level of an exemplary hierarchical hardware configuration with resource contention timelines in an embodiment of the present invention.

FIG. 5 depicts a hierarchical representation 500 of one of the web servers with resource contention timelines defined in the exemplary XML script. A WebServer 502 is an active resource as defined in line 2. At the next level of hierarchy, WebServer CPU 1 (504) and WebServer CPU 2 (508) are defined in lines 4-9 as two active resources of type "cpu" per web server. At the next level of hierarchy, lines 6-8 define Thread 1-Thread 10 (512-514) and Thread 1-Thread 10 (516-518) as 10 active resources of type "thread" per web server CPU, respectively.

Associated with each thread is a hardware model named "PentiumIII450 Mhz," as declared at line 7 (see hardware models 520-526). The "use template" declaration specifies that a template having a given name be used as the hardware model to represent a desired resource. The template construct is helpful because it allows a hardware model to be parameterized once within an XML script (not shown) and to be referenced multiple times using the "use template" declaration within the XML script.

In line 3, an RCT 502 named "memory" is associated with each WebServer resource. Likewise, in line 5, RCTs 506 and 510 named "cpu" are associated with each "WebServerCpu" resource. The CPU hardware models 520-526 are designed to "contribute" to both a CPU RCT and a memory RCT in the hierarchy.

In an alternative XML script, the user could specify the CPU RCT with the web server 502 (by moving the line "<rct name=cpu/>" between lines 4 and 6). In this alternative embodiment, one RCT would aggregate the contributions of both instances of the WebServerCpu into a single RCT. Accordingly, the flexibility of supporting assignment of an RCT at various levels of hierarchy allows a user to define a given level of resource contention precision in the simulation, both with regard to performance impact on the system and the feedback received by the user.

Figure 6:
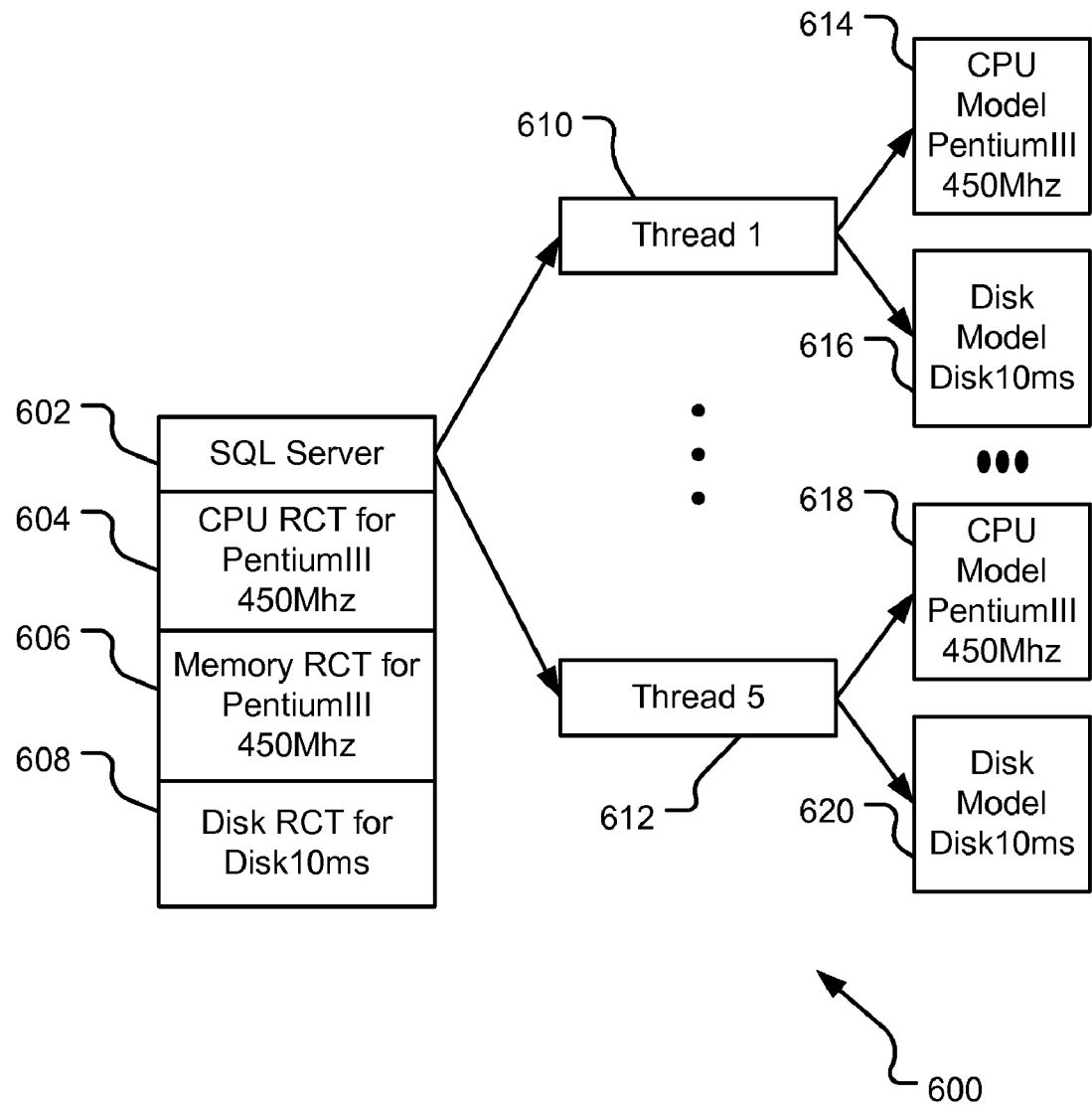
FIG. 6 depicts details of another level of an exemplary hierarchical hardware configuration with resource contention timelines in an embodiment of the present invention.

FIG. 6 depicts a hierarchical representation 600 of one of the SQL servers with resource contention timelines defined in the exemplary XML script. An SqlServer 602 is an active resource as defined in line 11. At the next level of hierarchy, lines 15-18 define Thread 1-Thread 5 (610-612) as 5 active resources of type "thread" for the single SQL server CPU. Associated with each thread is a hardware model named "Disk10 ms" and another hardware model named "PentiumIII450 Mhz," as declared at lines 16-17 (see hardware models 614-620).

In line 12, an RCT 604 named "cpu", an RCT 606 named "memory", and an RCT 608 named "disk" are associated with the SqlServer resource 602 and corresponding RCTs are associated with the other SqlServer resource (see e.g., SqlServer 2 (508) in FIG. 5). The CPU hardware models 614 and 618 are designed to contribute to both a CPU RCT and a memory RCT in the hierarchy. Likewise, the disk hardware models 616 and 620 are designed to contribute to a disk RCT in the hierarchy.

With regard to the exemplary XML script and the illustrations in FIGS. 5 and 6, each active resource may be designed to contribute to one or more types of RCT. During the evaluation stage of the performance simulation, each instance of an active resource hardware model is associated with the first RCT of the appropriate type that is encountered during a traversal up the hierarchy. For example, in FIG. 6, line 12 of the exemplary XML script associates the memory RCT with an SqlServer. Accordingly, the instances of the CPU hardware models 614 and 618 contribute to the CPU RCT 604, because RCT 604 is the first RCT encountered in a traversal up the hierarchy.

In contrast, an explicit RCT declaration is not required for passive resources. Passive resources may be declared by a "passive_resource" declaration (see e.g., line 24-26) and hardware model declaration (see e.g., line 25). In an embodiment of the present invention, intervening levels of hierarchy are unnecessary. As such, there is not need to specify which level of hierarchy to include the passive resource RCT—it is included at the top level of the passive resource hierarchy by default.

In one embodiment, hardware models for each active resource coupled to a passive resource may contribute to the passive resource's RCT (wherein the "coupling" is specified by the "link" declarations in the resource topology script), if the active resource hardware models are designed to contribute to a passive resource RCT. The operation of contributing to the passive resource RCT is designed into the hardware model.

For example, the web servers and the SQL servers declared in the exemplary XML script are linked to the backbone network resource, which is associated inherently with an Ethernet RCT. When a "send" event is processed by any web server or SQL server hardware model, the resource requirement value associated with that "send" event may be added to or otherwise combined with an RCT entry associated with the backbone network's RCT.

Figure 7A:
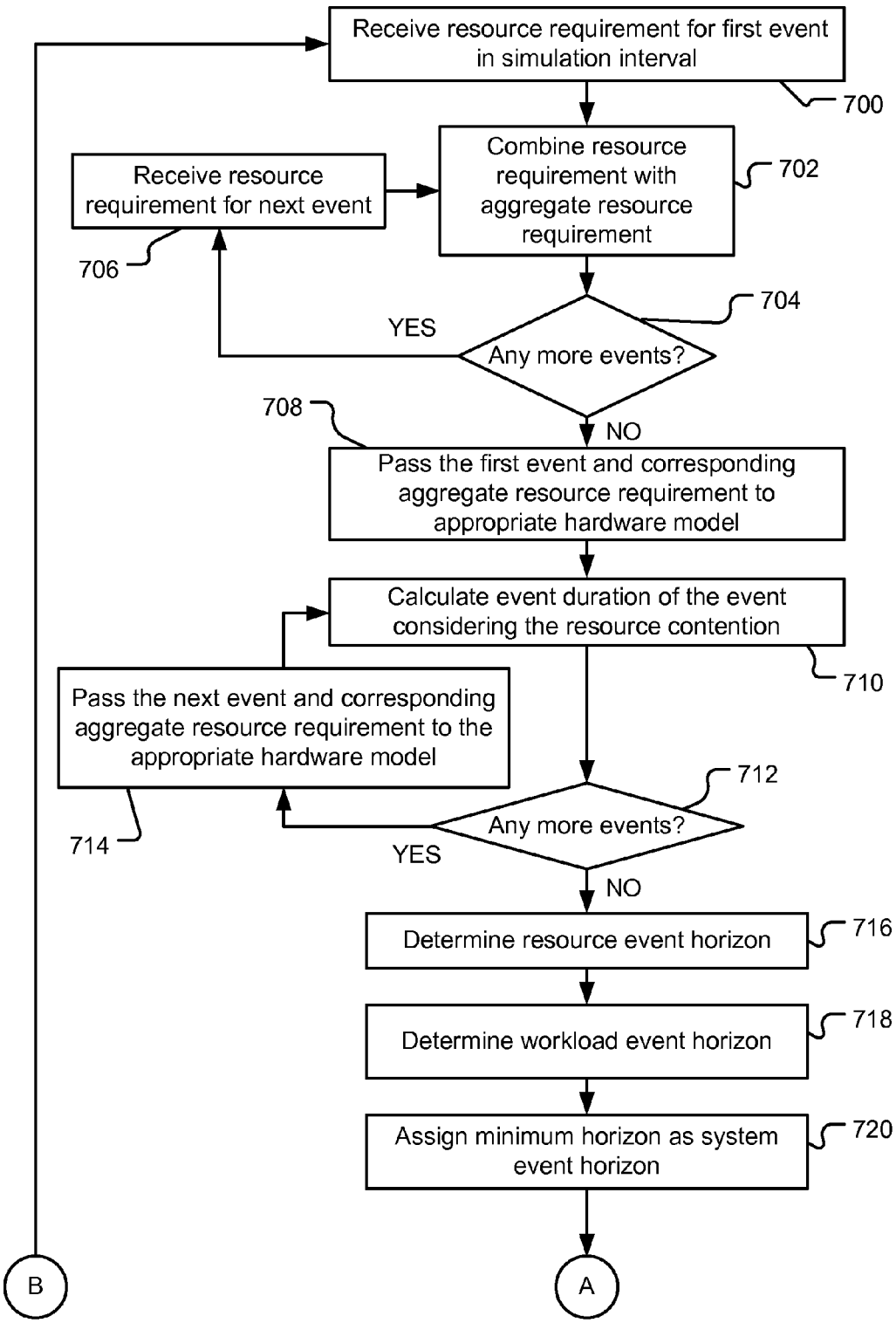
FIGS. 7A and B illustrate operations for creating resource contention timelines during simulation of a system in an embodiment of the present invention.
Figure 7B:
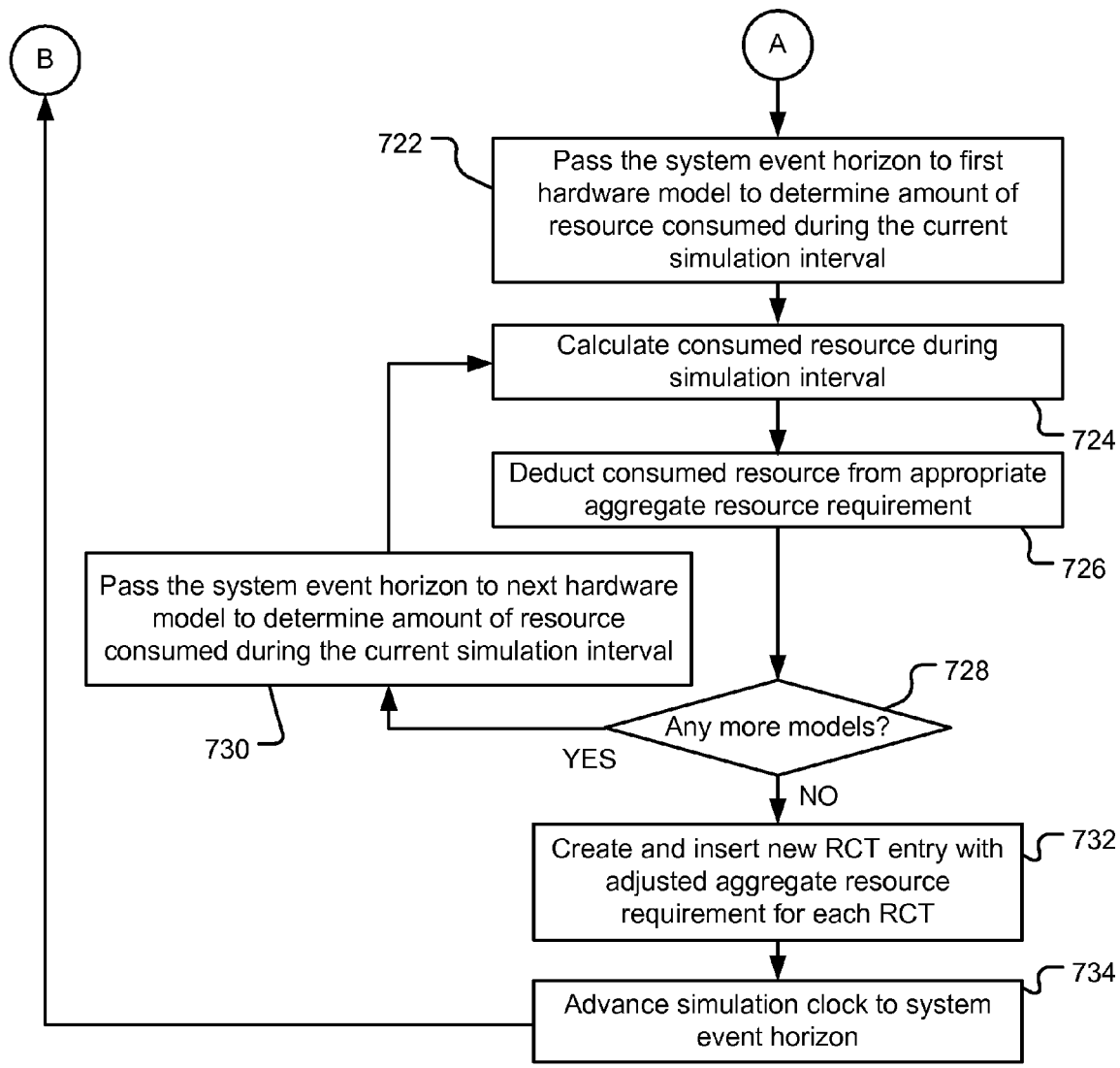

FIGS. 7A and 7B illustrate operations for creating RCTs during simulation of a system in an embodiment of the present invention. The RCT entries in each RCT record the total usage of an associated resource in a given simulation interval. The usage of the resource originates from events being processed during a given simulation interval. For example, a "compute" event in a web server may require 300 KB of memory and 10 Megacycles, both of which are exemplary resource requirements of the event. Accordingly, the CPU hardware model associated with the web server resource is said to "contribute" to a memory RCT and a CPU RCT associated with the web server resource.

Other events may also have resource requirements for the same memory and CPU RCTs in the same simulation interval. As such, the hardware models associated with those events also contribute to the RCTs to yield an aggregate resource requirement, which is recorded in the appropriate RCT entry of the memory or CPU timeline.

However, the resource requirements initially provided by each hardware model are based on the entire duration of an event. However, resource usage state changes within the system (e.g., newly activated events or completion of another active event) during event processing can cause the actual simulation interval to be shorter than the entire duration of an event. Accordingly, the aggregate resource requirement attributed to a resource is adjusted based on the duration of the calculated simulation interval.

Operations 700-706 generally traverse through the active events in a given simulation interval to calculate an aggregate resource requirement associated with each RCT. A receiving operation 700 receives the one or more resource requirements associated with a first event in a simulation interval. A combining operation 702 combines the one or more resource requirements with one or more associated aggregate resource requirements, which is typically initialized before the first iteration. For example, a "compute" event may require a predetermined amount of memory and a certain number of CPU cycles. Accordingly, the compute event associated with the CPU hardware model can contribute to a memory RCT and a CPU RCT.

A decision operation 704 determines whether any additional events exist to be processed during the current simulation operation. If so, a receiving operation 706 traverses to the next event and receives that event's resource requirement. Processing loops through operation 702-706 until the aggregate resource requirements associated with all RCTs have been satisfactorily calculated.

Operations 708-714 generally traverse the active events in the system, passing appropriate aggregate resource requirements to each hardware model to obtain calculated durations of the active events. A passing operation 708 passes a first event and an aggregate resource requirement to a corresponding hardware model. It should be understood that passing operation 708 may also involve multiple aggregate resource requirements and hardware models for a single event, in an embodiment of the present invention. A calculation operation 710 calculates the duration of a first pending event, taking into account the impact of the resource contention of the resources involved in the event. The calculation operation 710 is based on analytical methods and it typically adds extra delay to the cost of a workload request depending on the level of resource utilization. The analytical calculation is based on a statistical profile of the effects of resource contention of the target device. As an example, consider the effect of network traffic on a shared Ethernet segment. If resource utilization is not considered, the predicted time taken to transmit a message over the segment is a simple function of the size of the message. In real life, the time taken also depends on whether other messages are attempting to use the segment at the same instant in time. When multiple messages attempt to use the same network segment at the same time, message "collisions" occur, and the transmitting nodes back off until one gains exclusive use of the segment. This can be modeled using RCTs to determine the number of other active messages on the segment. If there are no collisions that occur, the previous simple function is used. Otherwise, the model can simulate the effects of the back-off process on the time taken by the message to traverse the segment. Other effects that are modeled can include, without limitation, context switching on a CPU with multiple threads, head thrashing on a storage disc storing multiple files being accessed simultaneously, and lock contention in a multithreaded software application under heavy use. In each exemplary scenario, the various contributions to the resource contention in the system is computed by the appropriate hardware models and recorded in an appropriate RCT entry.

A decision operation 712 determines whether there are any additional active events to be processed in this loop. If so, a passing operation 714 passes the next event and a corresponding aggregate resource requirement to the appropriate hardware model, and the processing loop continues to the calculation operation 710 to calculate the duration of the event. Otherwise, if there are no more events, a determination operation 716 determines the minimum duration of the active events in the simulation interval. This minimum duration is defines the "resource event horizon", the first time after the beginning of the current simulation interval.

A determination operation 718 determines the next time the state of the system changes, relative to resource usage. For example, when a new workload definition sequence starts based on its start time, the resource usage state of the system may change at that time because the first event in the new sequence requires resources to process it. The first time after the beginning of the current simulation interval that the resource usage state changes is referred to as the "workload event horizon". An assignment operation 720 determines the minimum of the resource event horizon and the workload event horizon and designates that minimum as the "system event horizon", which represents the duration of the current simulation interval.

It should be understood that the resource requirements initially received in the first loop of this process (i.e., the operations 700-706) represent the amount of resource consumed by an event during the entire duration of the event, without regard to the duration of the simulation interval. However, after the second loop, and more specifically the assignment operation 720, the actual duration of the simulation interval has been determined. Accordingly, a third loop (i.e., operations 722-730) prorates the aggregate resource requirements of each RCT entry for the current simulation interval.

The prorating effect is accomplished by passing the system event horizon to each of the hardware models to determine how much of each of the previously received resource requirements is consumed during the simulation interval as opposed to how much is consumed during the entire event. A passing operation 722 passes the system event horizon to a first hardware model to determine the resources consumed during the current simulation interval. A calculation operation 724 determines the amount of the resource that is consumed during the simulation interval. An interval operation 726 deducts the consumed resource amount (calculated in the calculation operation 724) from the aggregate resource requirement of the resource's associated RCT to obtain an adjusted aggregate resource requirement. A decision operation 728 determines whether any additional hardware models need to prorate their contributions to an RCT's aggregate resource requirement. If so, a passing operation 730 passes the system event horizon to the next hardware model to determine the amount of resource consumed during the current simulation interval and loops processing back to the calculation operation 724. Otherwise, if no more hardware models need to prorate their contribution, an insertion operation 732 creates an new RCT entry for each aggregate resource requirement and inserts it into the corresponding RCT.

A clocking operation 734 advances the simulation clock to the system event horizon (i.e., the end of the current simulation interval) to increment simulation to the next simulation interval. Processing then returns to the receiving operation 700 where the process repeats until the simulation is complete.

Figure 8:
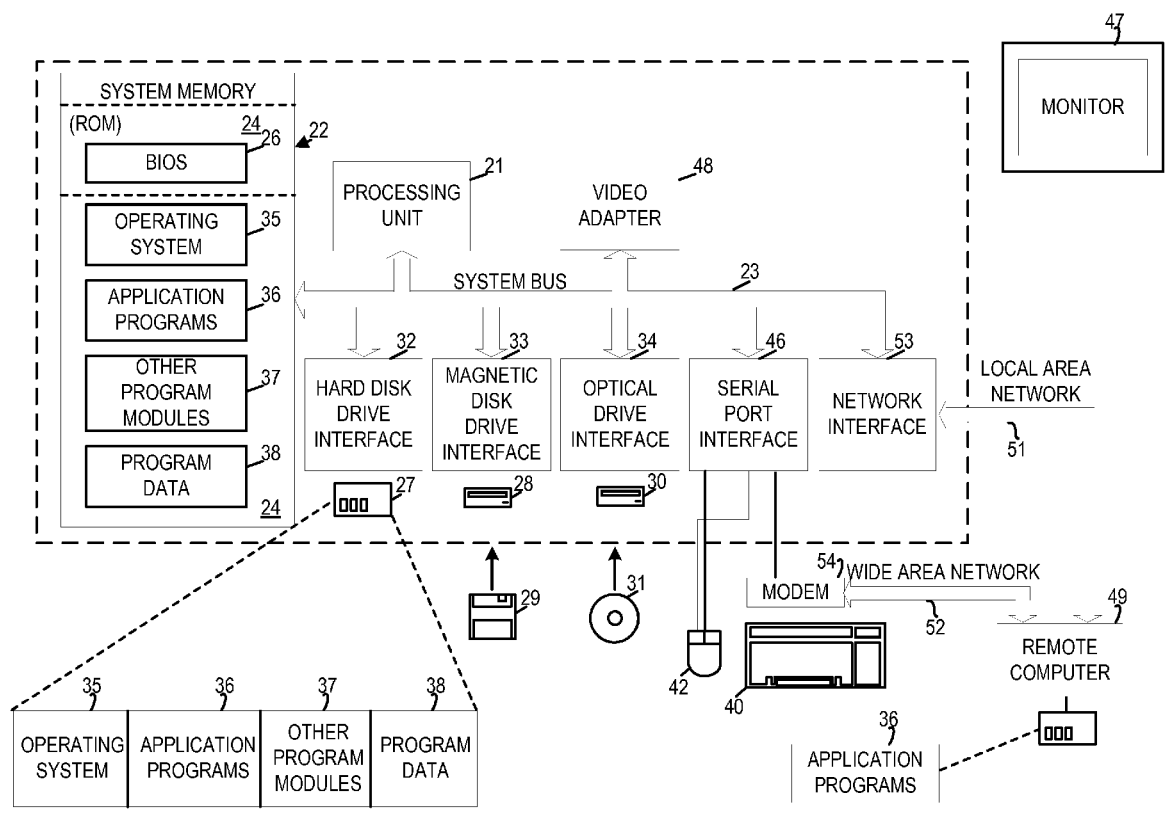
FIG. 8 illustrates an exemplary system useful for implementing an embodiment of the present invention.

The exemplary hardware and operating environment of FIG. 8 for implementing the invention includes a general purpose computing device in the form of a computer 20, including a processing unit 21, a system memory 22, and a system bus 23 that operatively couples various system components include the system memory to the processing unit 21. There may be only one or there may be more than one processing unit 21, such that the processor of computer 20 comprises a single central-processing unit (CPU), or a plurality of processing units, commonly referred to as a parallel processing environment. The computer 20 may be a conventional computer, a distributed computer, or any other type of computer; the invention is not so limited.

The system bus 23 may be any of several types of bus structures including a memory bus or memory controller, a peripheral bus, and a local bus using any of a variety of bus architectures. The system memory may also be referred to as simply the memory, and includes read only memory (ROM) 24 and random access memory (RAM) 25. A basic input/output system (BIOS) 26, containing the basic routines that help to transfer information between elements within the computer 20, such as during start-up, is stored in ROM 24. The computer 20 further includes a hard disk drive 27 for reading from and writing to a hard disk, not shown, a magnetic disk drive 28 for reading from or writing to a removable magnetic disk 29, and an optical disk drive 30 for reading from or writing to a removable optical disk 31 such as a CD ROM or other optical media.

The hard disk drive 27, magnetic disk drive 28, and optical disk drive 30 are connected to the system bus 23 by a hard disk drive interface 32, a magnetic disk drive interface 33, and an optical disk drive interface 34, respectively. The drives and their associated computer-readable media provide nonvolatile storage of computer-readable instructions, data structures, program modules and other data for the computer 20. It should be appreciated by those skilled in the art that any type of computer-readable media which can store data that is accessible by a computer, such as magnetic cassettes, flash memory cards, digital video disks, Bernoulli cartridges, random access memories (RAMs), read only memories (ROMs), and the like, may be used in the exemplary operating environment.

A number of program modules may be stored on the hard disk, magnetic disk 29, optical disk 31, ROM 24, or RAM 25, including an operating system 35, one or more application programs 36, other program modules 37, and program data 38. A user may enter commands and information into the personal computer 20 through input devices such as a keyboard 40 and pointing device 42. Other input devices (not shown) may include a microphone, joystick, game pad, satellite dish, scanner, or the like. These and other input devices are often connected to the processing unit 21 through a serial port interface 46 that is coupled to the system bus, but may be connected by other interfaces, such as a parallel port, game port, or a universal serial bus (USB). A monitor 47 or other type of display device is also connected to the system bus 23 via an interface, such as a video adapter 48. In addition to the monitor, computers typically include other peripheral output devices (not shown), such as speakers and printers.

The computer 20 may operate in a networked environment using logical connections to one or more remote computers, such as remote computer 49. In such a networked environment, a computer data signal containing data or instructions may be communicated among a plurality of computers. A computer data signal means a signal that has one or more of its characteristics set or changed in a manner as to encode information in the signal. By way of example, land not limitation, communications media such as wired media, including a wired network or direct-wired connection, and wireless media, including acoustic, radio frequency, infrared, and other wireless media, may communicate data or instructions among a plurality of computers. These logical connections are achieved by a communication device coupled to or a part of the computer 20; the invention is not limited to a particular type of communications device. The remote computer 49 may be another computer, a server, a router, a network PC, a client, a peer device or other common network node, and typically includes many or all of the elements described above relative to the computer 20, although only a memory storage device 50 has been illustrated in FIG. 1. The logical connections depicted in FIG. 1 include a local-area network (LAN) 51 and a wide-area network (WAN) 52. Such networking environments are commonplace in office networks, enterprise-wide computer networks, intranets and the Internal, which are all types of networks.

When used in a LAN-networking environment, the computer 20 is connected to the local network 51 through a network interface or adapter 53, which is one type of communications device. When used in a WAN-networking environment, the computer 20 typically includes a modem 54, a type of communications device, or any other type of communications device for establishing communications over the wide area network 52, such as the Internal. The modem 54, which may be internal or external, is connected to the system bus 23 via the serial port interface 46. In a networked environment, program modules depicted relative to the personal computer 20, or portions thereof, may be stored in the remote memory storage device. It is appreciated that the network connections shown are exemplary and other means of and communications devices for establishing a communications link between the computers may be used.

In an embodiment of the present invention, an evaluation engine that performs creates a resource contention timeline in performance prediction software may be incorporated as part of the operating system 35, application programs 36, or other program modules 37. The input data (including resource topology scripts), workload definition sequences, and simulation results associated with such performance prediction software may be stored as program data 38.

Figure 9:
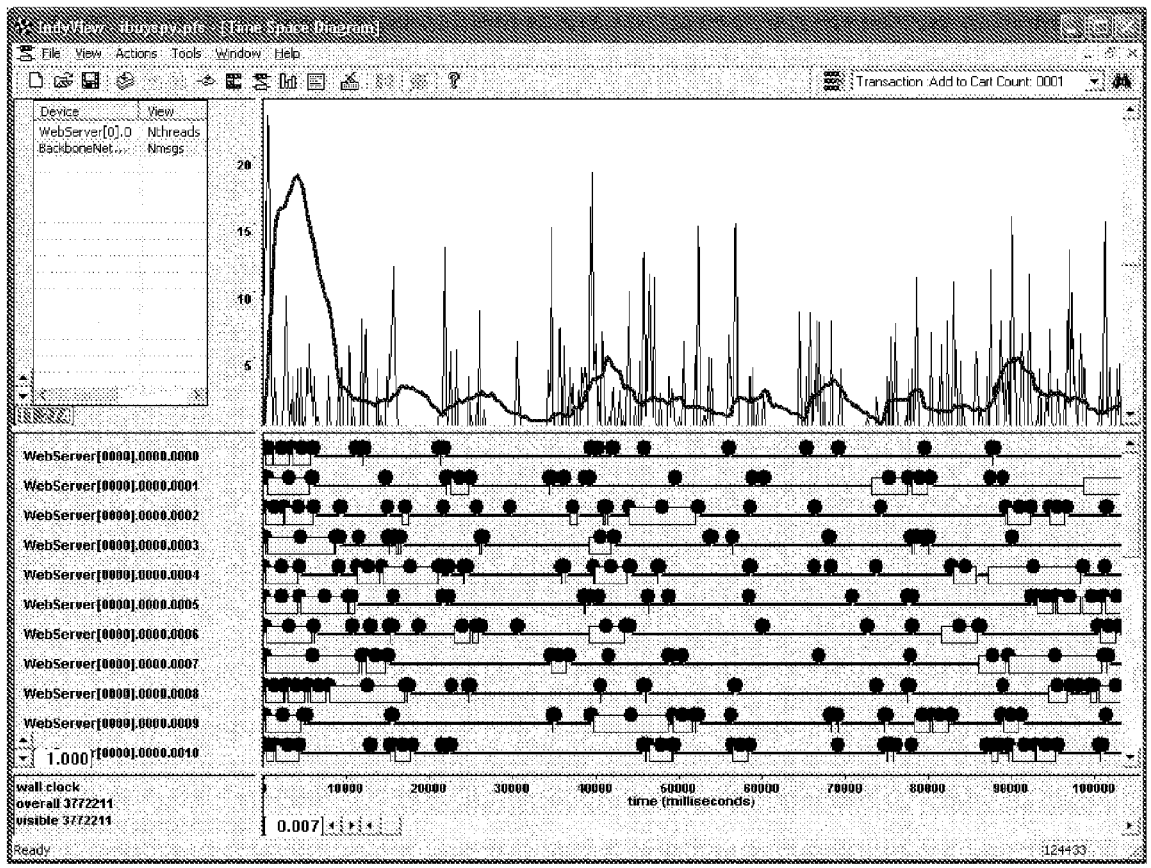
FIG. 9 shows a screen shot depicting graphical representations of resource contention timelines in an embodiment.

FIG. 9 shows a screen shot depicting graphical representations of resource contention timelines in an embodiment. An exemplary screenshot 900 illustrates resource contention in a simulated system in an embodiment of the present invention. The screenshot 900 present the resource contention to a user in a graphical format. In an alternative embodiment, a text display, including numerical data, may be presented to a user. In the top part of the screenshot 900 the graphical representation of two RCTs are shown. The RCT displayed with a highlighted line represents the number of messages that traverse the backbone network 416 of a two tier web farm. The second RCT represents the number of active threads of processing running on one of the Web Servers (408-414). The bottom part of the screenshot 900 shows a detailed view of the events that take place in the threads of execution of one of the Web Servers (408-414).

The embodiments of the invention described herein are implemented as logical steps in one or more computer systems. The logical operations of the present invention are implemented (1) as a sequence of processor-implemented steps executing in one or more computer systems and (2) as interconnected machine or software modules within one or more computer systems. The implementation is a matter of choice, dependent on the performance requirements of the computer system implementing the invention. Accordingly, the logical operations making up the embodiments of the invention described herein are referred to variously as operations, steps, objects, or modules.

The above specification, examples and data provide a complete description of the structure and use of exemplary embodiments of the invention. Since many embodiments of the invention can be made without departing from the spirit and scope of the invention, the invention resides in the claims hereinafter appended.

What is claimed is:

1. A computer readable storage medium having stored thereon a computer program that when executed by a computer system configures that computer system to create a computer process for determining an amount of a resource consumed during a simulation interval in a performance prediction simulation of a system including software and hardware elements, the computer process comprising:
    calculating by the computer system an aggregate resource requirement associated with the resource in a simulation interval;
    calculating by the computer system a system event horizon for the simulation interval based on a resource usage state change in the system; and
    adjusting the aggregate resource requirement based on the system event horizon to provide an adjusted aggregate resource requirement for the resource, wherein the adjusted aggregate resource requirement represents the amount of the resource consumed during the simulation interval; receiving one or more resource requirement contributions from one or more hardware models, each hardware model representing a resource associated with a resource contention timeline; and combining the resource requirement contributions from the one or more hardware models to provide the aggregate resource requirement.

2. The computer readable storage medium of claim 1 wherein the computer process further comprises:
    advancing a simulation clock to the system event horizon to start a next simulation interval.

3. The computer readable storage medium of claim 1 wherein the system includes a resource configuration, and the computer process further comprises:
    receiving a resource topology tree defining the resource configuration of the system, wherein the resource is specified by the resource topology tree.

4. The computer readable storage medium of claim 3 wherein the resource topology tree specifies at least one active resource.

5. The computer readable storage medium of claim 3 wherein the resource topology tree specifies at least one passive resource.

6. The computer readable storage medium of claim 1 wherein the combining operation comprises:
    adding the resource requirement contributions together.

7. The computer readable storage medium of claim 1 wherein the combining operation comprises:
    performing a bitwise OR operation on the resource requirement contributions.

8. The computer readable storage medium of claim 1 wherein the calculating a system event horizon comprises:
    determining a minimum event duration of active events to provide a resource event horizon;
    determining a workload event horizon based a start time of a newly activated event; and
    selecting an earlier one of the resource event horizon or the workload event horizon to provide the system event horizon.

9. The computer readable storage medium of claim 1 wherein the operation of calculating a system event horizon comprises:
    passing an aggregate resource requirement to a hardware model to determine a duration of an active event; and
    calculating in the hardware model the duration of the active event based on resource contention defined by the aggregate resource requirement.

10. The computer readable storage medium of claim 1 wherein the computer process further comprises:
    creating a resource contention timeline entry storing the adjusted aggregate resource requirement, an identifier of the associated resource, and a start time; and
    inserting the resource contention timeline entry into a resource contention timeline corresponding to the associated resource.

11. The computer readable storage medium of claim 10 wherein the computer process further comprises:
    presenting the resource contention timeline on a video display in a graphical format.

12. The computer readable storage medium of claim 10 wherein the computer process further comprises:
    presenting the resource contention timeline on a video display in a text format.

13. A computer readable storage medium having stored thereon a plurality of instructions that, when executed by one or more processors, causes the one or more processors to perform acts comprising:
    instantiating an instance of a data structure for recording resource contention of a system under simulation the data structure comprising elements representing a plurality data fields, the data fields comprising:
- the identification of system with which the data structure is associated;
- a resource associated with the system;
- a start time for a simulation interval;
- an amount of the resource utilized during a simulation interval; and
- an event horizon for the simulation interval;

maintaining the data structure on a computer readable storage media for subsequent population of the data fields;

calculating a system event horizon for the simulation interval based on a resource usage state change in the system; and writing the system event horizon to the computer readable storage medium in the event horizon data field of the data structure; wherein the data structure further comprises a data field containing the duration that the amount of resource used is valid, relative to the start time, during the simulation.

14. The computer readable storage medium of claim 13 wherein the data structure further comprises a data field containing the duration of the simulation interval.

15. The computer readable storage medium of claim 13 wherein the start time for a simulation interval and amount of the resource utilized during a simulation interval comprise a first resource contention timeline entry, and wherein the data structure further includes a second resource contention timeline entry logically coupled in sequence with the first resource timeline entry to define usage of the resource in the system during a plurality of simulation intervals.

16. The computer readable storage medium of claim 15 wherein a duration of the simulation interval associated with the first resource contention timeline entry is based on the difference between the start time of the second resource contention timeline entry and the start time of the first resource contention timeline entry.

17. A method of determining by a computing device an amount of a resource consumed during a simulation interval in a performance prediction simulation of a system, the method comprising:
- defining a resource configuration on the computing device of the system to include a resource;
- associating the resource with a resource contention timeline;
- calculating with the computing device an amount of the resource used during the simulation interval of the performance prediction simulation;
- calculating with the computing device an aggregate resource used during the simulation interval by (1) receiving one or more resource requirement contributions from one or more hardware models, each hardware model representing a resource associated with the resource contention timeline, and (2) combining the resource requirement contributions from the one or more hardware models to provide a value of the aggregate resource used;
- calculating by the computer system a system event horizon for the simulation interval based on a resource usage state change in the system;
- adjusting the value of the aggregate resource used based on the system event horizon to provide an adjusted aggregate resource requirement for the resource, wherein the adjusted aggregate resource requirement represents the amount of the resource consumed during the simulation interval; and
- inserting a resource contention timeline entry for the simulation interval into the resource contention timeline, the resource contention timeline entry specifying the adjusted aggregate resource requirement for the simulation interval associated with the resource contention timeline entry.

\* \* \* \* \*